US009070683B2

(12) United States Patent
Fender et al.

(10) Patent No.: US 9,070,683 B2
(45) Date of Patent: Jun. 30, 2015

(54) DIE FRACTURE DETECTION AND HUMIDITY PROTECTION WITH DOUBLE GUARD RING ARRANGEMENT

(71) Applicants: Jason R. Fender, Chandler, AZ (US); Ngai Ming Lau, Fountain Hills, AZ (US)

(72) Inventors: Jason R. Fender, Chandler, AZ (US); Ngai Ming Lau, Fountain Hills, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 155 days.

(21) Appl. No.: 13/922,759

(22) Filed: Jun. 20, 2013

(65) Prior Publication Data
US 2014/0375341 A1 Dec. 25, 2014

(51) Int. Cl.
*G01R 27/08* (2006.01)
*H01L 29/66* (2006.01)
*H01L 23/522* (2006.01)
*G01R 19/00* (2006.01)
*H01L 21/768* (2006.01)
*H01L 23/58* (2006.01)
*H01L 21/66* (2006.01)
*H01L 23/00* (2006.01)

(52) U.S. Cl.
CPC .......... *H01L 23/522* (2013.01); *G01R 19/0092* (2013.01); *H01L 21/768* (2013.01); *H01L 2924/1306* (2013.01); *H01L 23/585* (2013.01); *H01L 24/06* (2013.01); *H01L 24/48* (2013.01); *H01L 2224/04042* (2013.01); *H01L 2224/06134* (2013.01); *H01L 2224/48227* (2013.01); *H01L 2224/48247* (2013.01); *H01L 2924/10253* (2013.01); *H01L 2924/10272* (2013.01); *H01L 2924/10329* (2013.01); *H01L 2924/1033* (2013.01); *H01L 2924/1423* (2013.01); *H01L 22/34* (2013.01)

(58) Field of Classification Search
None
See application file for complete search history.

(56) References Cited

U.S. PATENT DOCUMENTS

| 5,284,801 | A | 2/1994 | Page et al. | |
| 5,396,100 | A * | 3/1995 | Yamasaki et al. | 257/390 |
| 6,649,986 | B1 | 11/2003 | Ishizaki et al. | |
| 7,649,200 | B1 | 1/2010 | Miller et al. | |
| 8,076,780 | B2 | 12/2011 | Saigoh et al. | |
| 2005/0127395 | A1* | 6/2005 | Saigoh et al. | 257/127 |
| 2013/0075859 | A1* | 3/2013 | Kerber | 257/531 |

OTHER PUBLICATIONS

Jason Fender et al., "Method for Detecting GaAs Die Fractures in Device Manufacturing Through the Use of a Designed Test Vehicle", CS MANTECH Conference, Apr. 23-26, 2012, 3 pages, Massachusetts.
Ofer Sneh et al., "Thin Film Atomic Layer Deposition Equipment for Semiconductor Processing", Thin Solid Films, 2002, pp. 248-261, vol. 402.

* cited by examiner

*Primary Examiner* — Minh N Tang
(74) *Attorney, Agent, or Firm* — Lempia Summerfield Katz LLC (57) ABSTRACT

An electronic apparatus includes a semiconductor substrate, outer and inner guard rings disposed along a periphery of the semiconductor substrate, and first and second contact pads electrically coupled to the outer and inner guard rings, respectively. The outer and inner guard rings are electrically coupled to one another to define a conduction path between the first and second contact pads. Each of the outer and inner guard rings includes an Ohmic metal layer having a plurality of gaps and further includes conductive bridges across the gaps. The gaps of the outer guard ring are laterally offset from the gaps of the inner guard ring such that the Ohmic metal layers of the outer and inner guard rings laterally overlap.

20 Claims, 4 Drawing Sheets

FIG. 6 ional, schematic view of an
inner guard ring of the double guard ring arrangement taken
along lines 3-3 in FIG. 2.
FIG. 4 is a partial, top view of an end connector or inter-
connect of the double guard ring arrangement in accordance
with one embodiment.
FIG. 5 is a flow diagram of an exemplary fabrication
sequence for an electronic apparatus having a double guard
ring arrangement for humidity protection and fracture detec-
tion in accordance with one embodiment.
FIG. 6 is a flow diagram of an exemplary method of testing
an electronic apparatus using a double guard ring arrange-
ment of the electronic apparatus in accordance with one
embodiment.

DETAILED DESCRIPTION OF THE PRESENTLY PREFERRED EMBODIMENTS

Semiconductor devices and apparatus having chip-level humidity protection and substrate defect detection (e.g., die crack detection) are described. Methods of fabricating and testing such apparatus are also described. The electronic apparatus may include a double guard ring arrangement that provides the benefits of a die crack detection ring and the benefits of a humidity suppression ring. The double guard ring arrangement provides a unique resistance signature that may be used in authentication, anti-counterfeiting efforts, and/or other identification of an electronic apparatus. The double guard ring arrangement integrates the humidity pro-
tection and die crack detection functions. Both functions are achieved while satisfying fabrication process conditions or restrictions.

The double guard ring arrangement may wrap around the periphery or edges of a semiconductor substrate or die. The double guard ring arrangement includes an outer guard ring configured primarily for humidity protection. The double guard ring arrangement further includes an inner guard ring connected to the outer guard ring, wrapped around the periph-
ery inside of the outer guard ring, and configured primarily for crack detection. However, the outer and inner guard rings are configured to support both humidity protection and crack detection, as a result of satisfying a fabrication process con-
dition or restriction prohibiting continuous rings of metal. The outer and inner guard rings may include segmented con-
stituent metal layers to satisfy the fabrication process condi-
tion.

For humidity protection, the outer guard ring may include a low impedance stack of constituent metal layers, such as an Ohmic metal layer and a first interconnect layer (e.g., a metal 1 layer). For die crack detection, the inner guard ring may primarily include an Ohmic metal layer. Each of the guard rings include segments or other portions that deviate from these configurations to address the function primarily pro-
vided by the other guard ring. To this end, the segments or portions of one guard ring may be aligned with, or offset from, corresponding segments or portions of the other guard ring. For example, a segment of the inner guard ring having a

DIE FRACTURE DETECTION AND HUMIDITY PROTECTION WITH DOUBLE GUARD RING ARRANGEMENT

FIELD OF INVENTION

The present embodiments relate to semiconductor devices.

BACKGROUND

Semiconductor devices used in high performance applica-
tions are often compound semiconductor devices. Group III-V semiconductors, such as GaAs and GaN, are typical compound semiconductor materials used in high perfor-
mance applications. GaAs devices are often used in high voltage, high power, and high frequency products. Volume production for more widespread application of such products has called for compound semiconductor device products to be small in size and cost competitive.

Interest in fabrication cost reduction has led to low cost packaging of compound semiconductor devices. High power and high frequency devices were traditionally packaged in hermetically sealed, cavity-type packages. Such packages usually provide adequate moisture protection at the chip level. Cheaper, plastic packaging does not provide a good moisture barrier. Plastic packages may thus leave moisture protection to the chip itself.

Ohmic fences have been used to provide moisture protec-
tion in GaAs devices and products with plastic packaging. Unfortunately, circuit layouts with ohmic fences were unable to prevent chip level failures during conventional tempera-
ture, humidity, bias (THB) testing. Humidity penetrating through the plastic packaging led to the failures.

GaAs devices are also at risk of fracture during the manu-
facturing process due to the brittle nature of the die substrate. The die is especially susceptible once the wafer is thinned. Die fractures are commonly a result of issues at singulation (wafer saw), tape transfer, die bond, wire bond, package singulation, test, or any other physical handling step. Unfor-
tunately, not all fractured devices fail an electrical test. For example, a fracture may not cross a circuit component capable of causing a failure. In other cases, the fracture may occur in the GaAs substrate, but the metallization above does not separate. The semi-insulating nature of the GaAs sub-
strate may allow a fracture to go undetected.

Die fractures typically result in an unpredictable rate of failure at the customer site. The fracture often increases dur-
ing a device reflow process for attachment to a circuit board. The increased fracture can then cause an electrical failure at the board level, even though the component passed a final test. In other scenarios, the fracture grows large enough to cause a failure only after use in the field.

Attempts to prevent customers from receiving fractured devices have included rigorous inspections at each of the various process steps likely to cause fractures. Such inspec-
tions are often not effective at detecting all defects. The inspections may also not be a viable manufacturing technique for multiple reasons. For example, the use of epoxy die attach materials and overmolding may inhibit any further inspec-
tions after those process steps.

BRIEF DESCRIPTION OF THE DRAWINGS

The components and the figures are not necessarily to scale, emphasis instead being placed upon illustrating the principles of the invention. Moreover, in the figures, like reference numerals designate corresponding parts throughout the different views.

FIG. 3 is a partial, cross-sect bridge over a gap to satisfy the fabrication process condition is aligned with a segment of the outer guard ring having no interconnect metal and, thus, only Ohmic metal, in the interest of providing die crack detection in that area.

Although described below in connection with substrates having compound semiconductor materials, the disclosed devices and fabrication methods are not limited to any particular substrate type or material. While the die crack detection may be useful in connection with GaAs substrates, the disclosed devices and methods are not limited to GaAs, GaN, SiC and other compound semiconductor substrates. For example, silicon substrates may be used. The construction of the semiconductor substrates of the disclosed devices may also vary. For example, the substrate may be configured as a silicon-on-insulator (SOI) substrate. Materials other than silicon may be used. The disclosed embodiments are compatible with a variety of process technologies and/or die technologies.

The disclosed embodiments may be useful in connection with a variety of integrated circuit (IC) products. In some cases, the IC products are monolithic microwave IC (MMIC) products. The double guard ring arrangements of the disclosed embodiments are not limited to MMIC products or devices.

Although described below in connection with field-effect transistor (FET) devices, the disclosed devices and methods are not limited to any particular transistor or other device configuration. The transistors are also not limited to a particular type of charge carrier or conductivity type. To the extent that any of the figures or examples imply a particular charge carrier or conductivity type, charge carriers of the opposite type may be provided by, for example, substitution of semiconductor regions of opposite conductivity type. Thus, for example, each semiconductor region, layer, or other structure in the examples described below may have a conductivity type, e.g, n-type or p-type, opposite to the type identified in the examples below.

Although described below in connection with plastic packages, the disclosed devices and methods are not limited to any particular packaging technology, material, or process. The disclosed devices need not be enclosed by a plastic housing. The extent to which the housing or packaging provides a moisture barrier may vary. The disclosed devices and methods may be combined with hermetic or near hermetic packaging to provide redundant protection against moisture or protection during fabrication before packaging. For example, the disclosed devices and methods may help to address moisture trapped within polyimide or other moisture-trapping materials. Such moisture may be blocked from further penetration into an active area or interface of the chip.

Figure 1:
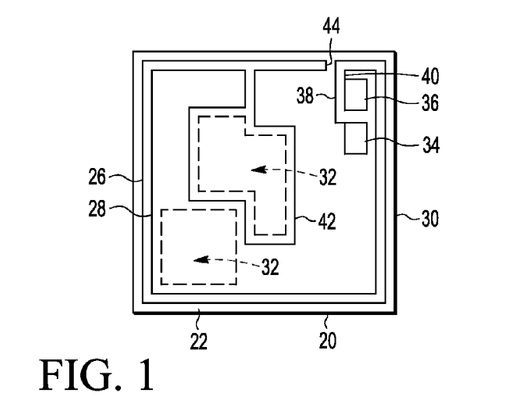
FIG. 1 is a top, schematic view of an exemplary electronic apparatus having a double guard ring arrangement for humid-
ity protection and fracture detection in accordance with one embodiment.

FIG. 1 shows a top view of an example of an electronic apparatus configured with chip-level humidity protection and fracture detection in accordance with one embodiment. In this example, the electronic apparatus is an integrated circuit (IC) device or chip 20. The IC chip 20 includes a semiconductor substrate 22. In one example, the semiconductor substrate 22 includes a GaAs or other Group III-V compound semiconductor material. Other compound and non-compound semiconductor materials may be used. The semiconductor substrate 22 may be a lightly or heavily doped p-type or n-type substrate. The IC chip 20 may be or include a die. In such cases, the semiconductor substrate 22 may be formed through dicing a semiconductor wafer. The semiconductor substrate 22 may be a composite substrate with any number of layers (e.g., epitaxial layers).

The IC chip 20 may include any number of transistor or other semiconductor devices formed in and/or supported by the semiconductor substrate 22. The semiconductor devices may be disposed in a circuit arrangement that extends laterally across a surface 24 (FIG. 3) of semiconductor substrate 22.

The structural, material, and other characteristics of the semiconductor substrate 22 may vary. Additional, fewer, or alternative layers may be included in the semiconductor substrate 22. For example, any number of additional semiconductor and/or non-semiconductor layers may be included. The disclosed devices are thus not limited to, for instance, bulk substrates. The semiconductor substrate 22 may be configured as a semiconductor-on-insulator (SOI) substrate. The semiconductor substrate 22 may be supported by a wide variety of other types of semiconductor or non-semiconductor substrates.

The IC chip 20 includes a double guard ring arrangement directed to providing humidity protection and fracture or crack detection, such as die crack detection. The guard ring arrangement includes an outer guard ring 26 and an inner guard ring 28. The outer and inner guard rings 26, 28 are disposed along a periphery 30 of the semiconductor substrate 22. In this example, the periphery 30 includes four edges. Each guard ring 26, 28 may be configured as a set of walls that run along, or wrap around, the four edges. The inner guard ring 28 wraps around the periphery 30 inside of the outer guard ring 26.

The outer and inner guard rings 26, 28 may be arranged as a double wall loop that wraps or loops around a circuit of the IC chip 20. Each guard ring 26, 28 may wrap around the circuit. The circuit may include a variety of different semiconductor devices arranged in circuit blocks or units. The blocks or units may be disposed in respective circuit areas 32. The double wall loop of the guard rings 26, 28 provides a composite Ohmic fence that prevents or minimizes humidity from reaching the circuit areas 32.

During operation of the circuit, the guard rings 26, 28 may be grounded or otherwise biased at a voltage to trap, collect, or otherwise block the moisture from reaching the circuit areas 32. Grounding or otherwise biasing the guard rings 26, 28 may help trap or block the moisture through electrostatic interactions with ions in the moisture, such as disassociated water ions or other ions. Any desired operating voltage may be established for the guard rings 26, 28. Moisture entering from an edge along the periphery 30 of the IC chip 20 thus encounters a grounded or biased metal fence, rather than simply an Ohmic barrier. The disclosed embodiments need not rely solely on the physical barrier to moisture penetration provided by the alloying of the conductive structures of the guard rings 26, 28 with the semiconductor substrate 22.

The IC chip 20 further includes contact pads 34, 36. The contact pads 34, 36 may be used to bias the guard rings 26, 28 during operation. In this example, the contact pad 34 is electrically coupled to the outer guard ring 26, while the contact pad 36 is coupled to the inner guard ring 28. The contact pads 34, 36 may be indirectly connected to the guard rings 26, 28. In this example, the contact pad 34 is connected to the outer guard ring 26 via an interconnect line 38, while the contact pad 36 is connected to the inner guard ring 28 via an interconnect line 40. Additional, fewer, or alternative interconnects or other conductive structures may be used to establish the connections.

One or both of the contact pads 34, 36 may be configured as bond pads. The configuration, construction, and other characteristics of the contact pads 34, 36 may vary. For example, the contact pads 34, 36 need not have a similar shape or size as shown. In this example, the contact pads 34, 36 are disposed in a common corner of the IC chip 20. The location of the contact pads 34, 36 may also vary. For example, one of the contact pads 34, 36 may be disposed in a distal corner or other portion of the IC chip 20. One of the contact pads 34, 36 may be remotely located from the other contact pad and/or the guard rings 26, 28. One or both of the contact pads 34, 36 may be shared with other circuit elements on the IC chip 20. For example, a number of circuit elements in addition to the guard rings 26, 28 may share a ground contact pad of the contact pads 26, 28.

The IC chip 20 is electrically testable as a result of the double guard ring arrangement. The semiconductor substrate 22 may be susceptible to fractures, cracks, or other defects (collectively, "cracks"). The outer and inner guard rings 26, 28 are electrically coupled to one another to define a conduction path between the contact pads 34, 36. The conduction path may be used to check the integrity of the semiconductor substrate 22. The contacts pads 34, 36 may be accessed to electrically test the conduction path. The conduction path is configured to break in the event that the semiconductor substrate 22 is cracked, e.g., a die crack. A high resistance, such as from about 10-1000Ω to about 1 MΩ, in the conduction path may be indicative of a crack. As described below, the outer and inner guard rings 26, 28 are configured to render the conduction path brittle or prone to opening electrically.

In this embodiment, the IC chip 20 includes an interconnect 44 to couple the guard rings 26, 28 to one another. The outer and inner guard rings 26, 28 may terminate at the interconnect 44. The interconnect 44 may thus be configured as an end connector. The interconnect 44 may couple the guard rings 26, 28 at a location near the interconnects 38, 40 that lead to the contact pads 34, 36. In this embodiment, the spacing between the interconnect 44 and the interconnect 38 may be minimized to avoid creating an appreciable breach in the humidity protection. For example, the size of the gap may fall in the range of about 3 μm to about 5 μm. If the gap is considered to present too large of a path for the moisture, then the interconnect 44 and/or the interconnect 38 may be shaped or otherwise configured to block or minimize moisture penetration, an example of which is described and shown below in connection with FIG. 4.

The inner guard ring 28 may cover territory on the IC chip 20 distal from the periphery 30 to detect die cracks away from the substrate edges. In the embodiment of FIG. 1, the inner guard ring 28 includes a loop section 42 that departs from, and returns to, the periphery 30 of the semiconductor substrate 22. The loop section 42 may return to the periphery 30 near the point from which it departs to detect cracks in that area along the periphery 30. Away from the periphery 30, the loop section 42 may wind through and/or around the circuit blocks or units in any desired pattern. In this example, the loop section 42 wraps around one of the circuit areas 32 and along the border of another one of the circuit areas 32. The shape of the loop section 42 may vary considerably from the example shown. The inner guard ring 28 may include any number of interior loop sections.

The terms "ring" or "ring-shaped" are used herein in a broad sense to include non-closed loop arrangements. As shown in the example of FIG. 1, the guard rings 26, 28 need not completely surround the circuit blocks or units of the IC chip 20. Each of the outer guard ring 26 and inner guard ring 28 includes a respective plurality of conductive structures disposed in a loop.

The guard ring arrangement may be spaced from the periphery 30 as desired. The proximity of the guard ring arrangement to the periphery 30 may be useful for preventing or minimizing moisture penetration into the IC chip 20. The lateral separation of the outer and inner guard rings 26, 28 may also vary. For example, the guard rings 26, 28 may be separated by about 2 μm to about 5 μm. In some cases, the spacing between the outer and inner guard rings 26, 28 may vary over the length of the guard rings 26, 28.

Figure 2:
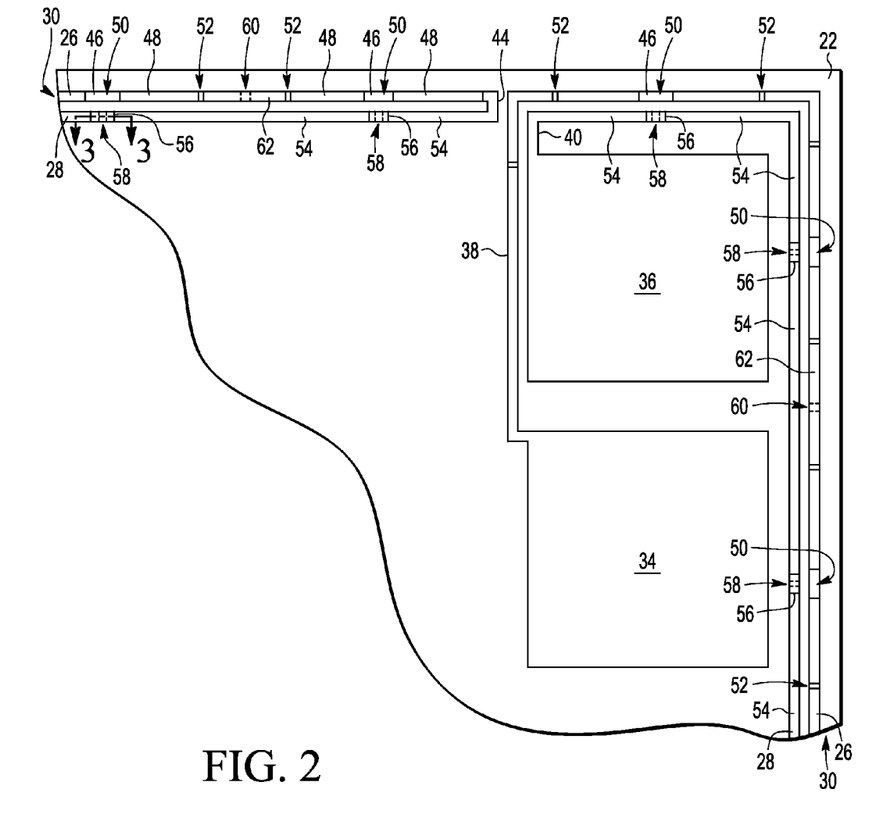
FIG. 2 is a partial, top, schematic view of the electronic apparatus of FIG. 1 to depict the double guard ring arrange-
ment in greater detail.

FIG. 2 shows the termination and connection of the outer and inner guard rings 26, 28 in greater detail. In this example, the interconnects 38, 44 are configured as straight, parallel lines. In other embodiments, the interconnects 38, 44 are not straight, non-parallel, or a combination thereof. An exemplary embodiment of a serpentine re-shaping of the interconnects 38, 44 is shown and described below in connection with FIG. 4. A variety of shapes other than straight lines may be used for one or both of the interconnects 38, 44. The interconnect 40 may also be otherwise shaped to accommodate the paths of the interconnects 38, 44.

In this example, the contact pads 34, 36 are adjacent one another and disposed near the interconnect 44. Other locations may be used. The contact pads 34, 36 need not be located in the same area of the IC chip 20. For example, one of the contact pads 34, 36 may be tied to ground, and located on the IC chip 20 at a suitable location for a ground terminal. The conduction path between the contact pads 34, 36 may thus include additional and/or alternative interconnects and/or other conductive structures between the guard rings 26, 28 and the contact pads 34, 36.

One or both of the contact pads 34, 36 may be sized, shaped, and otherwise configured as bond pads. The size, shape, and other characteristics of the contact pads 34, 36 may be suitable for wire bonding and/or contact via a probe. For example, the contact pad 34 may be wire bonded or otherwise configured as a ground terminal. During testing to detect a die crack, a probe may be used to apply a voltage, e.g., a DC voltage, to the contact pad 36. The relative size of the contact pad 36 and/or the contact pad 34 may be increased to accommodate the voltage application.

FIG. 2 also shows the configuration and construction of the outer and inner guard rings 26, 28 in accordance with one embodiment. The outer guard ring 26 may be primarily configured for humidity protection. The inner guard ring 28 may be primarily configured for die crack detection. However, certain segments or portions of the guard rings 26, 28 may be configured to support the other function, i.e., humidity protection by the inner guard ring 28 and/or die crack detection by the outer guard ring 26. Each guard ring 26, 28 is relied upon to support the other function, i.e., humidity protection or crack detection, at locations in which a gap or discontinuity is present in the other guard ring. For instance, in positions where a constituent metal layer of the outer guard ring 26 has a discontinuity, the inner guard ring 28 provides humidity protection. In positions where a constituent metal layer of the inner guard ring 28 has a discontinuity, the outer guard ring 26 provides die crack detection. Both guard rings 26, 28 may thus provide either humidity protection or die crack detection depending upon the location along the ring.

The outer guard ring 26 includes an Ohmic metal layer 46 adjacent the semiconductor substrate 22 to form an Ohmic fence to block the moisture. The outer guard ring 26 may also include a plurality of metal segments 48 distributed along and stacked upon the Ohmic metal layer 46 such that the outer guard ring 26 has a lower resistivity than the inner guard ring 28. The metal segments 48 may include gold and/or other low resistivity metals used for interconnects (interconnect metals). For example, the metal segments 48 may be fabricated as part of a first metal interconnect layer, e.g., metal 1. The resistivity of the metal segments 48 may be lower than the resistivity of the Ohmic metal layer 46. The Ohmic metal layer 46 is depicted in the plan view of FIG. 2 in gaps 50, 52 between the metal segments 48.

The inner guard ring 28 includes an Ohmic metal layer 54 adjacent the semiconductor substrate 22 and a number of conductive bridges 56 spanning across gaps 58 in the Ohmic metal layer 54. The conductive bridges 56 may be fabricated and/or configured similarly to the metal segments 48 of the outer guard ring 26. The conductive bridges 56 are distributed along the length of the inner guard ring 28. As shown in FIG. 2, compared with the outer guard ring 26, a significantly greater proportion of the Ohmic metal layer 54 of the inner guard ring 28 is not covered by the conductive bridges 56 or other metal segments. Without such metal coverage, the brittle nature of the Ohmic metal layer 54 provides sensitivity for die crack detection. The inner guard ring 28 may thus be more brittle than the outer guard ring 26 in those sections along the Ohmic metal layer 54 between the conductive bridges 56.

The brittle nature of the Ohmic metal layer 54 and other Ohmic metal layers described herein may be the result of an alloy(s) formed at the interface between the Ohmic metal layer 54 and the substrate 22. The alloy(s) may enter an amorphous state that is very brittle. Various metals may be used to form the alloy(s), including, for example, Au, Ni, Ge, Ga, and/or As. The alloy(s) may be incapable of stretching like low resistivity metals, such as Au.

The outer guard ring 26 supports the die crack detection function as follows. The metal segments 48 of the outer guard ring 26 are laterally offset from the gaps 58 of the inner guard ring 28. The Ohmic metal layer 46 of the outer guard ring 26 may thus be exposed or not covered by the metal of the metal segments 48. Without such coverage, the Ohmic metal layer 46 of the outer guard ring 26 may render the outer guard ring 26 more sensitive to die cracks in those areas. In contrast, the metal(s), such as gold, or metal layer(s) of the metal segments 48 may be malleable enough to not break upon a crack in the semiconductor substrate 22 or die. The gaps 50 between the metal segments 48 are laterally aligned with the gaps 58 of the inner guard ring 28 so that defects occurring near the gaps 50, 58 may be detected. The gaps 50 may be wider than the gaps 52 to provide the die crack detection coverage for the entire length of the gaps 58 in the Ohmic metal layer 54 of the inner guard ring 28. The size of the gaps 50, 52 may vary from the example shown. For example, the gaps 50 and 52 may have similar lengths.

The Ohmic metal layer 46 of the outer guard ring 26 also includes a number of gaps 60 as well as conductive bridges 62 across the gaps 60. The conductive bridges 62 may constitute one of the metal segments 48 crossing over one of the gaps 60. Each gap 60 may be laterally offset or spaced from the gaps 58 in the Ohmic metal layer 54 of the inner guard ring 28. In this example, each gap 60 is positioned at a midpoint between the gaps 58 in the Ohmic metal layer 54 of the inner guard ring 28. With the lateral offset of the gaps 46, 58, the Ohmic metal layers 46, 54 laterally overlap. The Ohmic metal layer 54 in the inner guard ring 28 may thus be present at each gap location in the outer ring 26. The inner guard ring 28 may thus be relied upon for die crack detection at such locations. The Ohmic metal layers of both guard rings may thus provide a staggered Ohmic fence for humidity protection.

The bridges 56, 62 establish the conduction path for the die crack detection testing, as well as for biasing of the guard rings 26, 28 for humidity protection during operation. The biasing of the guard rings 26, 28 may be achieved by applying a voltage, e.g., ground, to the contact pads 34, 36.

The gaps 50, 52, 58, 60 may be incorporated into the constituent metal layers of the guard rings 26, 28 in order to satisfy a fabrication condition or restriction related to patterning the metal layers through liftoff. The fabrication condition states that no metal feature may entirely and continuously surround or enclose an area on the IC chip 20. For example, the outer guard ring 26 or layer thereof may thus not form a complete, closed loop around the circuit(s) of the IC chip 20, despite the desirability of doing so for the humidity protection function. The fabrication condition applies to each constituent metal layer of the outer and inner guard rings 26, 28. Gaps are thus formed in each constituent metal layer. The number, location, and other characteristics of the gaps may vary.

The same constituent metal(s) or metal layers may be used to form the Ohmic metal layers 46, 54 of the outer and inner guard rings 26, 28. The same metal(s) may be used to form the metal segments 48 and the conductive bridges 56 of the outer and inner guard rings 26, 28. The conductive bridges 56 of the inner guard ring 28 may have a lower resistivity than the Ohmic metal layers 46, 54. In some embodiments, the inner guard ring 28 does not include any further conductive structures formed via the metals or metal layers used to form the metal segments 48 and the conductive bridges 56.

Figure 3:
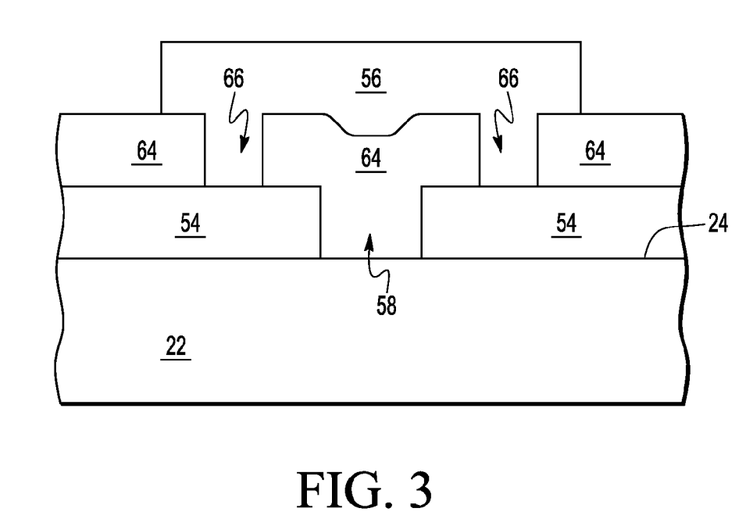

FIG. 3 is a cross-sectional view of the inner guard ring 28 (FIG. 2) to depict one of the conductive bridges 56 in greater detail. The Ohmic metal layer 54 is disposed at the surface 24 of the semiconductor substrate 22 and patterned to include the gap 58. One or more dielectric or passivation layers 64 are deposited in the gap 58 and patterned to provide openings 66 for the conductive bridge 56. The interconnect metal(s), such as the metal 1 stack, may then be deposited and patterned to form the conductive bridge 56 spanning the gap 58.

The conductive bridge 62 (FIG. 2) of the outer guard ring 26 may be configured similarly to the structure shown in FIG. 3. One difference may involve the dimension(s) of the interconnect metal(s) 56. The conductive bridge 62 may extend farther laterally than shown in FIG. 3. The increased extent of the conductive bridge 62 would be shown in the width dimension of the cross-sectional view of FIG. 3, and as a length dimension in the plan view of FIG. 2.

The outer and inner guard rings 26, 28 may have metal stacks or structures that differ from the ones described above. The number of metals or metal layers in the stacks may vary. For example, a metal layer or layer stack may be incorporated into one or both of the outer and inner guard rings 26, 28 in addition to the Ohmic metal layer and the interconnect metal layer. The Ohmic metal layer and the interconnect metal layer, such as metal 1, may include any number of constituent metals or metal layers. The Ohmic metal layer and the interconnect metal layer include a respective stack, such that portions or segments of the guard rings 26, 28 may be configured as a double stack. One or more metals or metal layers may be deposited as adhesion layers, transition layers, and/or other constituent layers.

The configuration of the metal stacks of the outer and inner guard rings 26, 28 may also vary. For instance, the Ohmic and interconnect metal layers need not have the same width. In one example, the conductive bridges 56 of the inner guard ring 28 are narrower or wider than the Ohmic metal layer 54.

Figure 4:
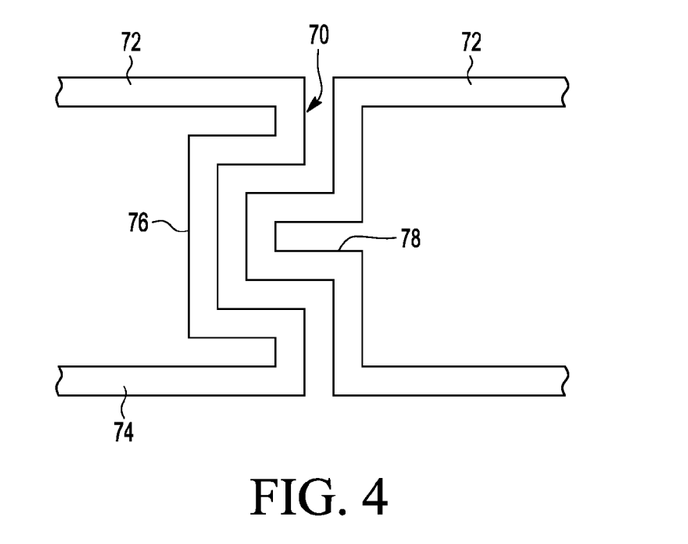

FIG. 4 depicts one example of an alternative end connector or interconnect 70 for electrically coupling an outer guard ring 72 and an inner guard ring 74. The interconnect 70 has a serpentine or winding shape rather than the straight line of the embodiment shown in FIGS. 1 and 2. In this example, the interconnect 70 includes an indented or C-shaped segment 76 sized to accommodate a segment 78 of the outer guard ring 72. The segment 78 of the outer guard ring 72 is interposed in the serpentine shape of the interconnect 70. The interconnect 70 and the segment 78 may thus laterally overlap to provide a better barrier to moisture despite the non-closed nature of the loops of the double guard ring arrangement.

Other shapes may be used for the interconnect 70 and/or the segment 78. For example, the interconnect 70 and the segment 78 need not have complementary or matching shapes as shown. The segment 76 may have additional or alternative indents. As shown in FIG. 1, the segment 78 may be a portion of an interconnect that departs from the periphery of the semiconductor substrate to reach a contact pad for the outer guard ring 72.

The double guard ring arrangements of the disclosed embodiments address the process condition regarding continuous rings, or no enclosed features, without adversely affecting the level of humidity protection and without sacrificing the electrical testability of the IC chip 20 for die crack detection. In some cases, further segmentation of the guard ring(s) may be useful. For instance, multiple double guard ring arrangements may be provided.

The double guard ring arrangements of the disclosed embodiments may remove the need for other or further discontinuities in one or both of the guard rings. The combination of the inner and outer guard rings may avoid the need for more complex guard ring configurations. For example, it is not necessary to use multiple rows of staggered, laterally overlapping segments, such as Ohmic metal layer only segments, connected by bridges, such as metal 1 interconnects, to satisfy the process condition for one or both guard rings. However, such staggered row configurations may be used for the inner guard ring and/or outer guard ring, if additional discontinuities are desired.

In embodiments having a Group III-V substrate, such as GaAs, InP, etc., the Ohmic metal layers described above may include Au-based material combinations, such as Ni/Au/Ge. Each Ohmic metal layer may be a composite structure or stack of multiple metal layers. Any metal, metal alloy, or other metal combination that forms an alloy with the semiconductor substrate may be used to form the Ohmic metal layer. In some cases, a silicide is formed. The metal layer or layers may be deposited via electroplating, dry etching, or any other now or hereafter developed deposition process.

One or more dielectric materials may be used for passivation. For example, the above-described dielectric layers may include silicon oxide, e.g., $SiO_2$, silicon nitride, e.g., $Si_3N_4$, silicon oxynitride ($SiO_xN_y$), aluminum oxide, e.g., $Al_2O_3$, etc. Any number of passivation layers may be deposited on the segments, bridges, and other conductive structures described above.

In some embodiments, the dielectric or passivation layers of the IC chip may include an atomic layer deposition (ALD) film or other conformal film at or along sidewalls of the metal layers. For instance, the dielectric layer 64 (FIG. 3) may be supplemented with a dielectric film that better conforms to sidewalls of the Ohmic metal layer and/or the interconnect layer. For example, one or more layers of the ohmic fence structures described herein may be coated with an ALD film. The improved conformity of the dielectric film may minimize or prevent moisture from passing the ohmic fence by, for instance, traveling along the metal-dielectric interface with cracks or other non-conformities. While such travel along or past the metal-dielectric interface at the conductive structures is unlikely given the electrostatic effects of the bias voltage, the conformal dielectric film may provide backup, redundant, or additional protection.

One or more additional conformal dielectric films may be deposited along sidewalls of the above-described bridges and other metal structures formed via the first metal layer of the IC chip 20, such as interconnects. The film(s) may be deposited to prevent cracks or other non-conformities from providing a moisture path along the interface between the metal stack of the bridges and the passivation layer(s) of the IC chip 20. Cracks and non-conformities may otherwise be present because the sidewalls are not coated or covered with an adhesion layer, such as a Ti adhesion layer. The passivation layer may be configured as an interlayer dielectric layer (ILD) of the passivation of multiple metal layers of the IC chip 20.

The conformal dielectric films may be formed via atomic layer deposition (ALD) techniques. Examples of conformal ALD films that may be used include aluminum oxide ($Al_2O_3$), aluminum nitride (AlN), and hafnium oxide ($HfO_2$). The conformal ALD film may include any one or more of such materials. The conformal dielectric film may be patterned such that only areas at or along the sidewalls are covered.

The bridges described above may be formed in connection with deposition of a first metal layer, e.g., M1, of the process of fabricating the IC chip. Each bridge may include a metal stack or other composite arrangement of the first metal layer. For example, each bridge may include one or more adhesion layers, one or more transition layers, and/or other layers in addition to a gold (Au) or other primary conduction layer. Exemplary materials for the adhesion layer(s) include Ti, TiN, TiW, Cr, etc. Exemplary materials for the transition layer(s) include Ni, Mo, Pd, Pt, etc., as well as alloys thereof or multi-layered composite metal films including any combination thereof. The construction, materials, and other characteristics of the metal stack or other configuration of the bridges may vary. Other metal layers, e.g., higher level metals, may be used.

The above-described IC chip 20 is shown in simplified form and, thus, FIGS. 1 and 2 do not show all of the metal, passivation, and/or other layers supported by the semiconductor substrate 22. FIGS. 1 and 2 also do not show any of the regions of the semiconductor substrate 22 configured to form one or more transistor or other devices of the IC chip 20. The IC chip 20 may have a number of other structures or components for connectivity, isolation, packaging, and other purposes not shown in FIG. 1 for ease in illustration. For instance, the IC chip 20 may include an enclosure, lead frame, or other packaging element coupled to the semiconductor substrate 22 and/or other components of the IC chip 20.

Figure 5:
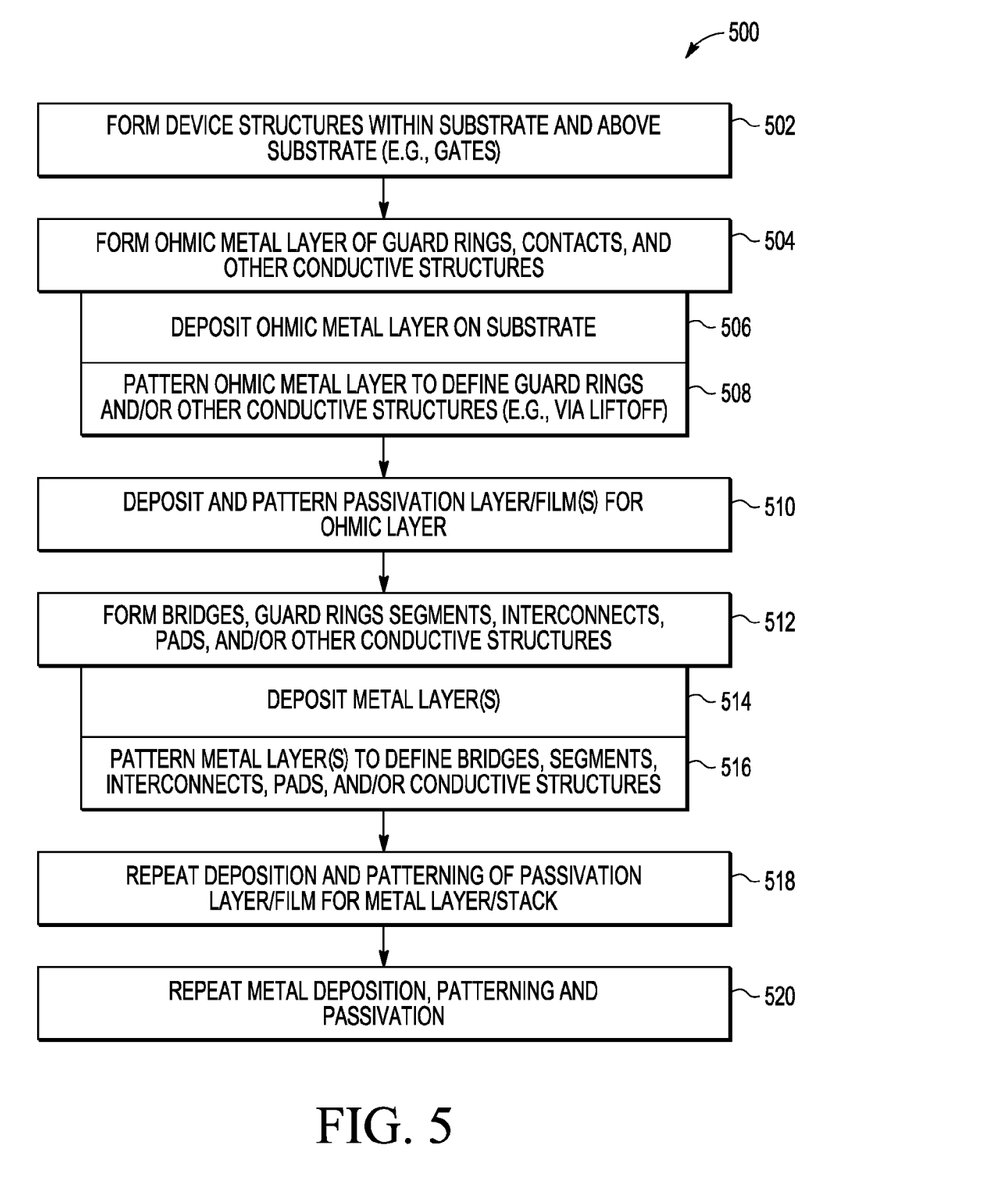

FIG. 5 shows an exemplary fabrication method 500 for fabricating an IC chip or electronic apparatus as described above. The IC chip is fabricated with a semiconductor substrate, which may be configured as described above. The method includes a sequence of acts or steps, only the salient of which are depicted for convenience in illustration. The ordering of the acts may vary in other embodiments. For example, the formation of the conductive structures may be performed in a different order. Additional, fewer, or alternative steps may be implemented. For example, one or more device implants may be implemented after the formation of one or more conductive structures. In another example, the Ohmic metal layer of some embodiments is not coated with a conformal dielectric layer.

The method may begin with, or include, a step 502 in which a number of device structures are formed in one or more circuit areas of a semiconductor substrate. The semiconductor substrate may correspond with a portion of a semiconductor wafer, which may be diced to form individual die at any time. The device structures may be formed by doping regions of the semiconductor substrate via, for instance, an implantation procedure. The regions may correspond with source regions, drain regions, device body regions, and other semiconductor device regions, and are not limited to any particular device type, such as a FET device. Formation of the device structures need not involve doping the semiconductor substrate. For example, the device structures may include isolation trenches and other structures. The step 502 may also include the formation of a number of device structures on or otherwise on or above a surface of the semiconductor substrate. For example, gate structures, silicide blocks, and other structures supported by the semiconductor substrate may be formed. In some cases, the IC chip may include one or more device structures formed at a later stage of the fabrication process. Not all device structures need be formed at this point in the process.

The semiconductor substrate may be a bulk semiconductor wafer. A variety of semiconductor materials may be used, including elementary semiconductors, such as Si, and compound semiconductors, such as GaAs. Other types of semiconductor substrates may be used, including, for example, an SOI substrate. The semiconductor substrate may include an original p-type semiconductor substrate on which the insulator, epitaxial, or other layers are grown or otherwise formed. In one example, an n+ buried layer is formed before the growth of the epitaxial layer(s) to achieve a depth that may not be possible or practical via an implantation-based procedure.

In a step 504, an ohmic metal layer of outer and inner guard rings is formed on the semiconductor substrate. The ohmic metal layer may be formed via the deposition of one or more metals or metal layers in a step 506. One or more alloys may be formed at the semiconductor substrate. For example, a silicide may be formed at the surface. The metal layer(s) may be deposited via any deposition process, including electroplating or other processes. The outer and inner guard rings are disposed along a periphery of the semiconductor substrate. The outer and inner guard rings are defined by patterning the Ohmic metal layer in a step 508. Such patterning leaves the Ohmic metal layer with a plurality of gaps. As described above, the gaps of the outer guard ring are laterally offset from the gaps of the inner guard ring such that the Ohmic metal layers of the outer and inner guard rings laterally overlap. The patterning may include implementing a liftoff procedure, but other procedures may be used for patterning the Ohmic metal layer.

In some embodiments, the patterning of the Ohmic metal layer may form further conductive structures. For example, the Ohmic metal layer may form a loop section of the inner guard ring. The loop section departs from, and returns to, the periphery of the semiconductor substrate, as described above. As another example, an end connector or interconnector is formed that couples the outer and inner guard rings to one another. In some cases, the end connector has a serpentine shape in which a segment of the outer guard ring is interposed such that the end connector and the segment laterally overlap.

One or more passivation layers and/or films are deposited in a step 510. For example, sidewall(s) of the structures defined in the Ohmic metal layer may then be covered or coated by a conformal dielectric film. The conformal dielectric film may be deposited via an ALD process as described above. The ALD or other conformal dielectric film may have a thickness, for example, in a range from about 100 Angstroms to about 1000 Angstroms. The conformal dielectric film is deposited at or along the edges of the ohmic metal layer to cover the sidewall(s).

A dielectric passivation layer may be deposited to support the formation of one or more metal interconnect layers. A variety of dielectric materials may be used for the passivation layer, including, for instance, silicon nitride ($Si_3N_4$). The dielectric passivation layer may be deposited via a variety of different processes, including various CVD processes. In this example, the conformal dielectric film and the dielectric passivation layer are patterned together in the step 510. The conformal dielectric film may be patterned separately in other embodiments.

After the patterning of the passivation layer, a variety of different circuit elements, device structures, or other conductive structures may be formed in a step 512. The formation of the structures may begin with deposition of an interconnect metal layer or stack of layers in a step 514. The interconnect metal layer may be patterned, e.g., via a liftoff procedure, in a step 516 to define the elements and structures. Such elements or structures may include, for instance, guard ring segments, bridges, interconnects, and contact pads, of the outer and inner guard rings. As described above, each bridge spans a respective gap in the Ohmic metal layer of either the outer guard ring or the inner guard ring.

In some cases, the structures may be stacked upon, connected to, or otherwise coupled to the ohmic metal layer, as described above. For example, the interconnect metal layer is configured to form a plurality of metal segments distributed along and stacked upon the Ohmic metal layer of the outer guard ring. The interconnect metal layer may be patterned such that the inner guard ring does not include the metal interconnect layer other than the conductive bridges. The outer guard ring may thus have a lower resistivity than the inner guard ring. The metal segments of the outer guard ring are laterally offset from the gaps of the inner guard ring. In other cases, the interconnect metal layer is configured to form interconnects, such as an interconnect that extends from the segment of the outer guard ring to reach one of the contact pads. In some embodiments, other interconnects may be formed above a portion of the Ohmic metal layer, including, for instance, the interconnect or end connector that electrically couples the outer and inner guard rings to one another to define a conduction path between the contact pads.

Passivation deposition and patterning may then be repeated in a step 518. Alternatively, separate conformal dielectric films may be deposited during the formation of the layers of a metal stack. The step 518 may include deposition of another passivation layer to allow further metal layers to be deposited and defined. Patterning of the conformal dielectric film and passivation layer may be repeated any number of iterations to accommodate, for instance, a desired number of metal interconnect layers deposited and patterned in a step 520.

Additional acts may be implemented at various points during the fabrication procedure. Any number of metal layers may be deposited to establish interconnections and create circuit elements of the IC chip. The procedures may be implemented in various orders. Additional or alternative procedures may be implemented.

Figure 6:
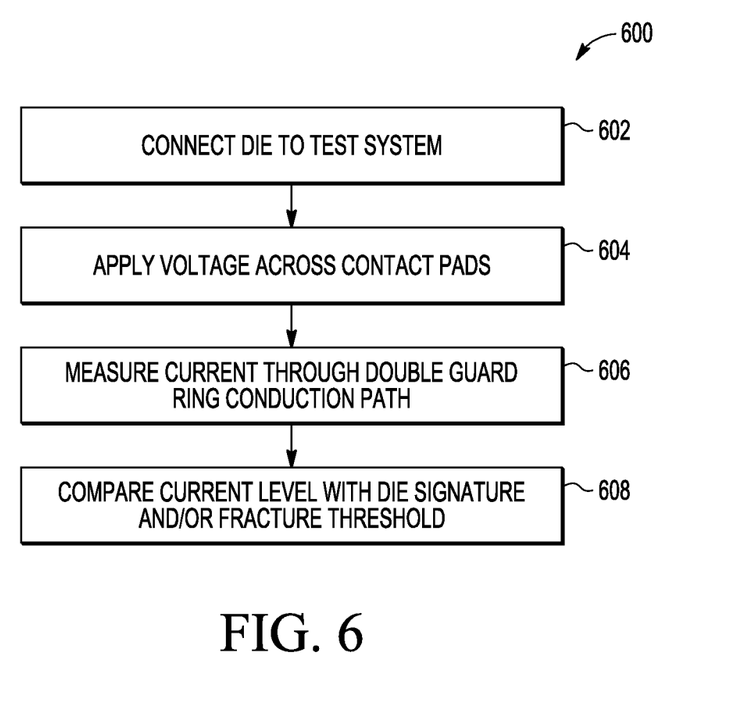

FIG. 10 depicts a method 600 of testing an IC chip or electronic apparatus having a double guard ring arrangement as described above. The arrangement includes outer and inner guard rings disposed along a periphery of a semiconductor substrate of the electronic apparatus. Each guard ring includes an Ohmic metal layer having a plurality of gaps laterally offset from the gaps in the other guard ring, as described above. The method includes a sequence of acts or steps, only the salient of which are depicted for convenience in illustration. The ordering of the acts may vary in other embodiments. For example, some of the acts may be implemented concurrently.

The method begins in a step 602 in which the IC chip is connected to a test system or device. The connection may be established via one or more probes configured to make contact with bond pad(s) or other contact pad(s) electrically coupled to the guard ring arrangement. Alternatively or additionally, a pin or other structure may be used to access the guard ring arrangement. Once connected to the IC chip, a voltage across may be applied across the contact pads in a step 604 to direct current through a conduction path including the guard rings. The resulting current through the conduction path is measured in a step 606.

In a step 608, the measured current level is compared with one or more predetermined threshold current levels. The comparison may be directed to confirming the integrity of the IC chip or substrate thereof. One or more threshold current levels may be indicative of a proper configuration of the conduction path. For example, a pair of threshold current levels may define a range in which the current falls for a given voltage when the IC chip is in normal operating condition. If the measured current falls within the range, then the IC chip may be characterized as free from substrate defects, such as die cracks or fractures.

The threshold current levels may also be used to authenticate or identify the IC chip. The double guard ring arrangement may be configured to present a unique resistance signature based on, for instance, the configuration of the above-described segments of the outer guard ring, the length of any interior loop of the inner guard ring, the number of gaps and bridges, and other characteristics. Such characteristics may be used to establish a unique resistance level for the guard rings, which, in turn, may be used to identify or otherwise authenticate the IC chip. Counterfeit chips may be identified through such testing.

The integrity of the IC chip may be confirmed or tested via one or more threshold current levels indicative of a substrate defect, such as a die crack or fracture. A defect need not result in an open circuit. In some cases, the defect results in an abnormally large resistance (e.g., low current level) for the guard ring conduction path. If the current level fails to exceed such threshold level(s), the IC chip may be considered to be defective.

Additional acts may be implemented at various points during the testing method. The method may include further acts directed to diagnosing or identifying a defect. The method may include iterating or modifying the voltage application. For example, an AC voltage may be applied to characterize the nature of the crack, fracture, or other defect. Additional or alternative procedures may thus be implemented.

In a first aspect, an electronic apparatus includes a semiconductor substrate, outer and inner guard rings disposed along a periphery of the semiconductor substrate, and first and second contact pads electrically coupled to the outer and inner guard rings, respectively. The outer and inner guard rings are electrically coupled to one another to define a conduction path between the first and second contact pads. Each of the outer and inner guard rings includes an Ohmic metal layer having a plurality of gaps and further includes conductive bridges across the gaps. The gaps of the outer guard ring are laterally offset from the gaps of the inner guard ring such that the Ohmic metal layers of the outer and inner guard rings laterally overlap.

In a second aspect, a method of fabricating an electronic apparatus includes forming an Ohmic metal layer of outer and inner guard rings on a semiconductor substrate, the outer and inner guard rings being disposed along a periphery of the semiconductor substrate and patterned such that the Ohmic metal layer has a plurality of gaps, and depositing an interconnect metal layer to form conductive bridges of the outer and inner guard rings, each conductive bridge spanning a respective gap of the plurality of gaps. The outer and inner guard rings are electrically coupled to one another to define a conduction path between contact pads of the electronic apparatus. The gaps of the outer guard ring are laterally offset from the gaps of the inner guard ring such that the Ohmic metal layers of the outer and inner guard rings laterally overlap.

In a third aspect, a method of testing an electronic apparatus includes connecting the electronic apparatus to a test system to direct current through a conduction path including outer and inner guard rings disposed along a periphery of a semiconductor substrate of the electronic apparatus. Each guard ring includes an Ohmic metal layer having a plurality of gaps laterally offset from the gaps in the other guard ring. The method further includes measuring current through the conduction path and comparing the measured current with a predetermined current level indicative of a configuration of the conduction path for authentication of the electronic apparatus.

The present invention is defined by the following claims and their equivalents, and nothing in this section should be taken as a limitation on those claims. Further aspects and advantages of the invention are discussed above in conjunction with the preferred embodiments and may be later claimed independently or in combination.

While the invention has been described above by reference to various embodiments, it should be understood that many changes and modifications may be made without departing from the scope of the invention. It is therefore intended that the foregoing detailed description be regarded as illustrative rather than limiting, and that it be understood that it is the following claims, including all equivalents, that are intended to define the spirit and scope of this invention.

The invention claimed is:

1. An electronic apparatus comprising:
a semiconductor substrate;
outer and inner guard rings disposed along a periphery of the semiconductor substrate;
first and second contact pads electrically coupled to the outer and inner guard rings, respectively;
wherein the outer and inner guard rings are electrically coupled to one another to define a conduction path between the first and second contact pads;
wherein each of the outer and inner guard rings comprises an Ohmic metal layer having a plurality of gaps and further comprises conductive bridges across the gaps;
wherein the gaps of the outer guard ring are laterally offset from the gaps of the inner guard ring such that the Ohmic metal layers of the outer and inner guard rings laterally overlap.

2. The electronic apparatus of claim 1, wherein the outer guard ring comprises a plurality of metal segments distributed along and stacked upon the Ohmic metal layer such that the outer guard ring has a lower resistivity than the inner guard ring.

3. The electronic apparatus of claim 2, wherein the metal segments of the outer guard ring are laterally offset from the gaps of the inner guard ring.

4. The electronic apparatus of claim 1, wherein the conductive bridges comprise a metal layer having a lower resistivity than the Ohmic metal layer, and wherein the inner guard ring does not include any further conductive structures comprising the metal layer other than the conductive bridges.

5. The electronic apparatus of claim 1, wherein the outer and inner guard rings are configured such that, for sections along the Ohmic metal layer between the conductive bridges of the inner guard ring, the inner guard ring is more brittle than the outer guard ring.

6. The electronic apparatus of claim 1, wherein the inner guard ring comprises a loop section that departs from, and returns to, the periphery of the semiconductor substrate.

7. The electronic apparatus of claim 1, further comprising an end connector that couples the outer and inner guard rings to one another, the end connector having a serpentine shape in which a segment of the outer guard ring is interposed such that the end connector and the segment laterally overlap.

8. The electronic apparatus of claim 7, wherein the segment comprises an interconnect that departs from the periphery to reach the first contact pad.

9. The electronic apparatus of claim 1, wherein the outer and inner guard rings are configured as a double wall loop disposed along the periphery of the semiconductor substrate.

10. A method of fabricating an electronic apparatus, the method comprising:
    forming an Ohmic metal layer of outer and inner guard rings on a semiconductor substrate, the outer and inner guard rings being disposed along a periphery of the semiconductor substrate and patterned such that the Ohmic metal layer has a plurality of gaps;
    depositing an interconnect metal layer to form conductive bridges of the outer and inner guard rings, each conductive bridge spanning a respective gap of the plurality of gaps;
    wherein the outer and inner guard rings are electrically coupled to one another to define a conduction path between contact pads of the electronic apparatus;
    wherein the gaps of the outer guard ring are laterally offset from the gaps of the inner guard ring such that the Ohmic metal layers of the outer and inner guard rings laterally overlap.

11. The method of claim 10, wherein depositing the interconnect metal layer is configured to form a plurality of metal segments distributed along and stacked upon the Ohmic metal layer of the outer guard ring such that the outer guard ring has a lower resistivity than the inner guard ring.

12. The method of claim 11, wherein the metal segments of the outer guard ring are laterally offset from the gaps of the inner guard ring.

13. The method of claim 10, further comprising patterning the interconnect metal layer such that the inner guard ring does not include the metal interconnect layer other than the conductive bridges.

14. The method of claim 10, wherein the outer and inner guard rings are configured such that, for sections along the Ohmic metal layer between the conductive bridges of the inner guard ring, the inner guard ring is more brittle than the outer guard ring.

15. The method of claim 10, wherein forming the Ohmic metal layer is configured to form a loop section of the inner guard ring that departs from, and returns to, the periphery of the semiconductor substrate.

16. The method of claim 10, wherein forming the Ohmic metal layer is configured to form an end connector that couples the outer and inner guard rings to one another, the end connector having a serpentine shape in which a segment of the outer guard ring is interposed such that the end connector and the segment laterally overlap.

17. The method of claim 16, wherein depositing the interconnect metal layer is configured to form an interconnect that extends from the segment of the outer guard ring to reach one of the contact pads.

18. The method of claim 10, wherein forming the Ohmic metal layer comprises patterning the Ohmic metal layer via a liftoff procedure.

19. A method of testing an electronic apparatus, the method comprising:
    connecting the electronic apparatus to a test system to direct current through a conduction path comprising outer and inner guard rings disposed along a periphery of a semiconductor substrate of the electronic apparatus, each guard ring comprising an Ohmic metal layer having a plurality of gaps laterally offset from the gaps in the other guard ring;
    measuring current through the conduction path; and
    comparing the measured current with a predetermined current level indicative of a configuration of the conduction path for authentication of the electronic apparatus.

20. The method of claim 19, further comprising comparing the measured current with a predetermined threshold current level to confirm integrity of the electronic apparatus.

* * * * *